(12) United States Patent
Giroux et al.

(10) Patent No.: US 11,142,345 B2
(45) Date of Patent: Oct. 12, 2021

(54) SYSTEM AND METHOD FOR PERFORMING A TEST PROCEDURE

(71) Applicant: Bell Helicopter Textron Inc., Fort Worth, TX (US)

(72) Inventors: Sébastien Giroux, St-Joseph-du-lac (CA); Cédric Roche, Saint-Eustache (CA)

(73) Assignee: Textron Innovations Inc., Providence, RI (US)

(*) Notice: Subject to any disclaimer, the term of this patent is extended or adjusted under 35 U.S.C. 154(b) by 3 days.

(21) Appl. No.: 16/546,025

(22) Filed: Aug. 20, 2019

(65) Prior Publication Data

US 2019/0382140 A1 Dec. 19, 2019

Related U.S. Application Data

(63) Continuation-in-part of application No. 15/663,804, filed on Jul. 30, 2017, now abandoned.

(30) Foreign Application Priority Data

Jun. 22, 2017 (CA) .................................. CA 2971890

(51) Int. Cl.
*G01R 31/00* (2006.01)
*B64F 5/60* (2017.01)
(Continued)

(52) U.S. Cl.
CPC ................. *B64F 5/60* (2017.01); *B64C 27/04* (2013.01); *B64F 1/00* (2013.01); *B64F 5/40* (2017.01);
(Continued)

(58) Field of Classification Search
CPC ............ G01R 31/2834; G01R 31/2851; G01R 31/002; G01R 31/31924; G01R 31/40; G01R 31/02
(Continued)

(56) References Cited

U.S. PATENT DOCUMENTS

| 5,111,402 A | 5/1992 | Brooks et al. |
| 5,986,462 A | 11/1999 | Thomas et al. |

(Continued)

FOREIGN PATENT DOCUMENTS

| CA | 2621196 A1 | 3/2006 |
| CA | 2291657 C | 4/2007 |

(Continued)

OTHER PUBLICATIONS

Office Action in related Canadian Patent Application No. 2971890, dated Apr. 24, 2018, 4 pages.

*Primary Examiner* — Raul J Rios Russo
(74) *Attorney, Agent, or Firm* — Lightfoot & Alford PLLC

(57) ABSTRACT

A system and method for performing a test procedure on a system under test are provided. An actuation unit operatively coupled to the system under test is configured to perform at least one operation thereon. A visual recognition unit is configured to capture at least one image of the system under test in real-time. A test unit remotely interfaced with the system under test is configured to perform the test procedure. Using the test unit, the test procedure is retrieved from the memory, at least one control signal is output to the actuation unit for causing the at least one operation to be performed in real-time for testing the system under test in accordance with the one or more test instructions, and the at (Continued)

least one image of the system under test is monitored as the at least one operation is performed for validating the test procedure in real-time.

16 Claims, 6 Drawing Sheets

(51) Int. Cl.
| | |
|---|---|
| *G05D 1/00* | (2006.01) |
| *B64F 1/00* | (2006.01) |
| *B64F 5/40* | (2017.01) |
| *G07C 5/00* | (2006.01) |
| *B64C 27/04* | (2006.01) |
| *G01V 3/12* | (2006.01) |
| *G01V 3/08* | (2006.01) |
| *G01V 3/28* | (2006.01) |
| *G01V 3/38* | (2006.01) |
| *G01V 3/16* | (2006.01) |
| *G01R 31/28* | (2006.01) |
| *G01R 31/319* | (2006.01) |
| *G01R 31/40* | (2020.01) |
| *G01V 11/00* | (2006.01) |

(52) U.S. Cl.
CPC ....... *G01R 31/002* (2013.01); *G01R 31/2834* (2013.01); *G01R 31/2851* (2013.01); *G01R 31/31924* (2013.01); *G01R 31/40* (2013.01); *G01V 3/083* (2013.01); *G01V 3/12* (2013.01); *G01V 3/16* (2013.01); *G01V 3/28* (2013.01); *G01V 3/38* (2013.01); *G05D 1/0016* (2013.01); *G07C 5/008* (2013.01); *G01V 11/00* (2013.01); *G01V 11/007* (2013.01); *G01V 2210/6163* (2013.01)

(58) Field of Classification Search
USPC ......... 324/71, 378, 403, 415, 425, 500, 537, 324/750.01
See application file for complete search history.

(56) References Cited

U.S. PATENT DOCUMENTS

| | | | |
|---|---|---|---|
| 6,122,575 A | 9/2000 | Schmidt et al. | |
| 6,219,626 B1 | 4/2001 | Steinmetz et al. | |
| 6,269,319 B1 | 7/2001 | Neisch et al. | |
| 6,434,930 B1 | 8/2002 | Cullen et al. | |
| 6,598,002 B1 | 7/2003 | Claverie | |
| 6,751,536 B1 | 6/2004 | Kipersztok et al. | |
| 6,868,319 B2 | 3/2005 | Kipersztok et al. | |
| 7,251,550 B2 | 7/2007 | Eschborn et al. | |
| 7,368,919 B2 | 5/2008 | Gervais | |
| 7,636,568 B2 | 12/2009 | Gould et al. | |
| 7,689,327 B2 | 3/2010 | Loda | |
| 7,908,052 B2 | 3/2011 | Howlett et al. | |
| 8,000,844 B2 | 8/2011 | Mottura | |
| 8,103,475 B2 | 1/2012 | Sorenson | |
| 8,131,406 B2 | 3/2012 | Morris et al. | |
| 8,184,437 B2 | 5/2012 | Berlekamp | |
| 8,224,503 B2 | 7/2012 | Piolet et al. | |
| 8,274,297 B2 | 9/2012 | Kruse et al. | |
| 8,306,689 B2 | 11/2012 | Koepping et al. | |
| 8,321,083 B2 | 11/2012 | Beebe et al. | |
| 8,326,230 B2 | 12/2012 | Schirrmacher et al. | |
| 8,335,601 B2 | 12/2012 | Sham et al. | |
| 8,564,300 B2 | 10/2013 | Knoop et al. | |
| 8,583,316 B2 | 11/2013 | Weiler et al. | |
| 8,593,270 B2 | 11/2013 | Knoop | |
| 8,606,538 B2 | 12/2013 | Cahon et al. | |
| 8,761,993 B2 | 6/2014 | Ric et al. | |
| 8,812,154 B2 | 8/2014 | Vian et al. | |
| 8,849,603 B2 | 9/2014 | Boldrin et al. | |
| 8,874,421 B2 | 10/2014 | Stunkel et al. | |
| 8,879,410 B1 | 11/2014 | Kostrzewski et al. | |
| 8,958,945 B2 | 2/2015 | Ovens | |
| 9,047,771 B1 | 6/2015 | Thoreen et al. | |
| 9,128,913 B2 | 9/2015 | Boucher et al. | |
| 9,469,417 B2 | 10/2016 | Beaujard et al. | |
| 9,508,267 B2 | 11/2016 | Galibois et al. | |
| 9,541,505 B2 | 1/2017 | Kesler et al. | |
| 2004/0153800 A1 | 8/2004 | Germanetti | |
| 2005/0256662 A1 | 11/2005 | Alder | |
| 2008/0198742 A1 | 8/2008 | Kaempfer | |
| 2009/0070635 A1 | 3/2009 | Depraz et al. | |
| 2010/0100766 A1* | 4/2010 | Bengtsson | H04W 24/06 714/23 |
| 2011/0047529 A1 | 2/2011 | Randimbivololona | |
| 2013/0267179 A1* | 10/2013 | Parekh | H04L 41/22 455/67.11 |
| 2014/0178853 A1* | 6/2014 | Groninger | G09B 5/00 434/365 |
| 2014/0219123 A1 | 8/2014 | Diebenbusch et al. | |
| 2015/0095717 A1* | 4/2015 | Frenz | G06F 11/2294 714/46 |
| 2015/0363296 A1 | 12/2015 | Lee et al. | |
| 2016/0019732 A1 | 1/2016 | Fournier et al. | |
| 2016/0026256 A1 | 1/2016 | Massu et al. | |
| 2016/0083117 A1 | 3/2016 | Woida-O'Brien | |
| 2016/0327596 A1* | 11/2016 | Salajegheh | G01R 31/001 |
| 2016/0345113 A1* | 11/2016 | Lee | G01S 15/04 |
| 2017/0124816 A1* | 5/2017 | Yang | G06Q 10/0833 |
| 2019/0187139 A1* | 6/2019 | Xie | G01N 33/54386 |
| 2019/0332514 A1* | 10/2019 | Frenz | H04N 7/183 |

FOREIGN PATENT DOCUMENTS

| | | |
|---|---|---|
| CA | 2696020 A1 | 4/2009 |
| CA | 2704798 A1 | 6/2009 |
| CA | 2705632 A1 | 6/2009 |
| CA | 2804534 A1 | 8/2013 |
| CA | 2946168 A1 | 12/2014 |
| CA | 2936101 A1 | 9/2015 |
| CA | 2951071 A1 | 12/2015 |
| CA | 2736920 C | 10/2016 |
| EP | 0985155 B1 | 7/2002 |
| EP | 1236986 A2 | 9/2002 |
| EP | 1307804 A2 | 5/2003 |
| EP | 1502121 A1 | 2/2005 |
| EP | 1588311 A | 10/2005 |
| EP | 1831706 A1 | 9/2007 |
| EP | 1840755 A2 | 10/2007 |
| EP | 2012210 A1 | 1/2009 |
| EP | 2015085 A1 | 1/2009 |
| EP | 2042430 A2 | 4/2009 |
| EP | 2166455 A1 | 3/2010 |
| EP | 2215486 A1 | 8/2010 |
| EP | 2232285 A1 | 9/2010 |
| EP | 2266880 A1 | 12/2010 |
| EP | 2278494 A2 | 1/2011 |
| EP | 2300968 A1 | 3/2011 |
| EP | 2375335 A1 | 10/2011 |
| EP | 2626303 A1 | 8/2013 |
| EP | 2874106 A1 | 5/2015 |
| EP | 2975362 A1 | 1/2016 |
| EP | 2345184 B1 | 4/2016 |
| EP | 3101536 A1 | 12/2016 |
| EP | 3114670 A2 | 1/2017 |
| EP | 3121666 A1 | 1/2017 |
| WO | 2015166223 A1 | 11/2015 |
| WO | 2015185637 A1 | 12/2015 |
| WO | 2016193712 A1 | 12/2016 |

\* cited by examiner

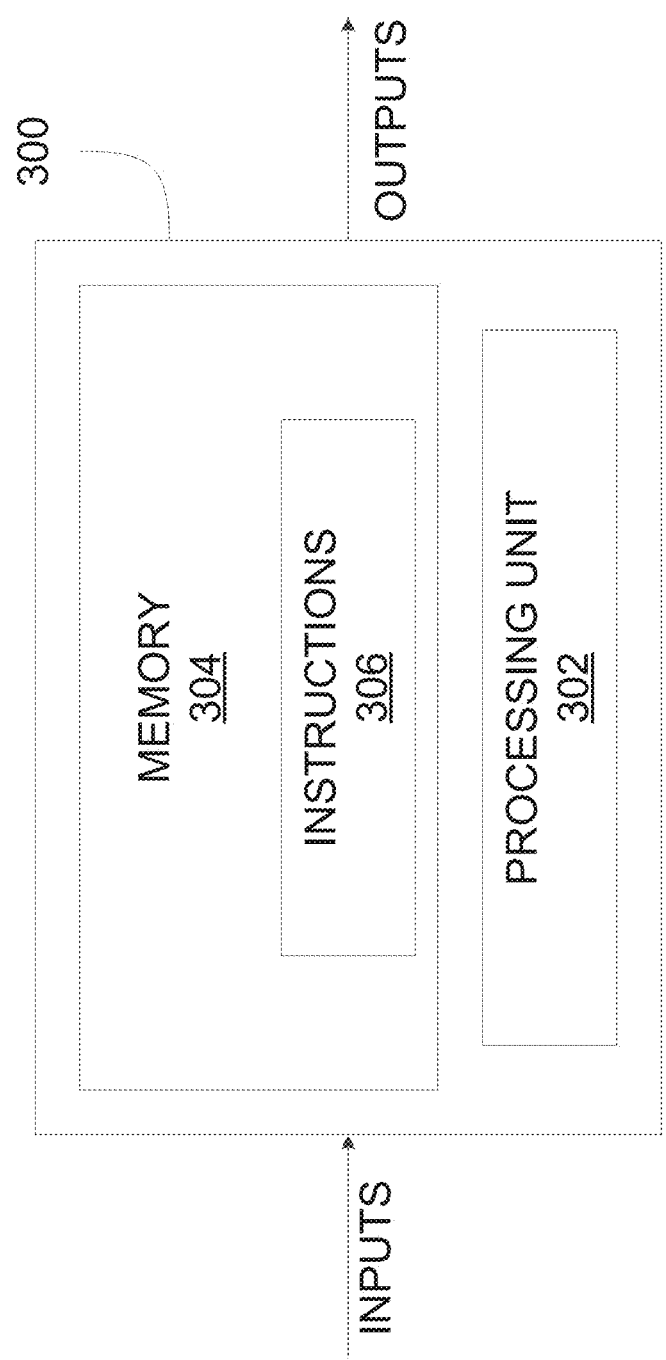

SYSTEM AND METHOD FOR PERFORMING A TEST PROCEDURE

CROSS-REFERENCE TO RELATED APPLICATIONS

This patent application is a continuation in part of U.S. application Ser. No. 15/663,804, filed on Jul. 30, 2017, which claims priority under 35 USC § 119(e) of Canadian Application No. 2971890, filed on Jun. 22, 2017, the entire contents of which are hereby incorporated by reference.

FIELD

Embodiments described herein generally relate to the field of testing, more particularly to performing a Functional Test Procedure (FTP) on an aircraft system.

BACKGROUND

A Functional Test Procedure (FTP) defines the manner in which a unit under test, such as an aircraft system, should be tested to determine whether the unit under test is functionally sound. Each FTP is typically written for a particular unit under test and comprises a sequence of tests. Based on the FTP, in each test, one or more input signals are applied to terminals of the unit under test and the result output signals are measured and compared to expected results to assess a pass or fail of the FTP test. If an FTP test fails, the test results may be used to diagnose and troubleshoot the faulty unit under test.

In current FTP processes, operators are required to interpret the FTP instructions and perform a number of manual operations accordingly. This usually requires significant travel to and from the aircraft (e.g. to read FTP instructions) and the connector area (e.g. to connect and disconnect connectors). In addition to having a negative impact on operator health and safety, the high degree of physical movement around the aircraft increases the amount of time required to perform the FTP, therefore enhancing the complexity of the overall procedure. Interpretation of the FTP instructions can also result in an increased possibility of human error.

There is therefore a need for an improved system and method for performing a test procedure.

SUMMARY

In accordance with one aspect, there is provided a system for performing a test procedure on a system under test. The system comprises an actuation unit operatively coupled to the system under test and configured to perform at least one operation thereon, a visual recognition unit configured to capture at least one image of the system under test in real-time, and a test unit remotely interfaced with the system under test and configured to perform the test procedure thereon, the test unit comprising a non-transitory memory having stored therein the test procedure comprising one or more test instructions for testing the system under test, at least one processing unit, and at least one application stored in the memory and executable by the at least one processing unit for retrieving the test procedure from the memory, outputting at least one control signal to the actuation unit for causing the at least one operation to be performed in real-time for testing the system under test in accordance with the one or more test instructions, and monitoring the at least one image of the system under test as the at least one operation is performed for validating the test procedure in real-time.

In some embodiments, the actuation unit comprises a robotic arm.

In some embodiments, the visual recognition unit comprises at least one image acquisition device with graphic recognition capability.

In some embodiments, the at least one application is executable by the at least one processing unit for outputting the at least one control signal for causing the at least one operation comprising at least one of simulating a short to ground, disconnecting a connector, injecting a signal, injecting a voltage, injecting a current, simulating a resistance, simulating an impedance, simulating a capacitance, simulating an inductance, measuring a voltage, measuring a current, measuring a resistance, measuring an impedance, measuring a capacitance, measuring an inductance, pressing a switch, turning a knob, and entering data through an input device associated with the system under test to be performed.

In some embodiments, the system under test is an aircraft system selected from the group consisting of a hydraulics system, an engine system, a fuel system, a navigation system, a landing gear system, a flap control system, an electricity generating system, and a cabin climate control system.

In some embodiments, the test unit is electrically interfaced with the system under test through at least one cable connecting each electrical connector of the system under test to the test unit.

In some embodiments, the visual recognition unit is configured to capture the at least one image of at least one standby aircraft instrument.

In some embodiments, the at least one application is executable by the at least one processing unit for monitoring the at least one image in real-time and determining at least one test result therefrom, comparing the at least one test result to at least one test criterion defined by the test procedure, responsive to determining that the at least one test result satisfies the at least one test criterion, concluding to a pass of the test procedure, and, responsive to determining that the at least one test result does not satisfy the at least one test criterion, concluding to a failure of the test procedure.

In some embodiments, the system further comprises a troubleshooting unit connected to the test unit and configured to automatically troubleshoot the system under test responsive to concluding to the failure of the test procedure.

In accordance with another aspect, there is provided a method for performing a test procedure on a system under test. The method comprises remotely interfacing a test unit with the system under test, and using the test unit, retrieving from memory the test procedure comprising one or more test instructions for testing the system under test, outputting at least one control signal for causing at least one operation to be performed on the system under test in real-time for testing the system under test in accordance with the one or more test instructions, and monitoring at least one image of the system under test for validating the test procedure in real-time, the at least one image captured in real-time as the at least one operation is performed.

In some embodiments, the at least one control signal is output for causing the at least one operation comprising at least one of simulating a short to ground, disconnecting a connector, injecting a signal, injecting a voltage, injecting a current, simulating a resistance, simulating an impedance, simulating a capacitance, simulating an inductance, measuring a voltage, measuring a current, measuring a resistance, measuring an impedance, measuring a capacitance, measuring an inductance, pressing a switch, turning a knob, and entering data through an input device associated with the system under test to be performed.

In some embodiments, remotely interfacing the test unit with the system under test comprises electrically interfacing the test unit with the system under test through at least one cable connecting each electrical connector of the system under test to the test unit.

In some embodiments, the method further comprises integrating the test unit and at least one avionic test equipment on a workstation electrically interfaced with the system under test.

In some embodiments, the method further comprises monitoring the at least one image in real-time and determining at least one test result therefrom, comparing the at least one test result to at least one test criterion defined by the test procedure, responsive to determining that the at least one test result satisfies the at least one test criterion, concluding to a pass of the test procedure, and responsive to determining that the at least one test result does not satisfy the at least one test criterion, concluding to a failure of the test procedure.

In some embodiments, the method further comprises automatically troubleshooting the system under test responsive to concluding to failure of the test procedure.

In accordance with another aspect, there is provided a non-transitory computer readable medium having stored thereon program code executable by a processor for retrieving from memory a test procedure comprising one or more test instructions for testing a system under test, outputting at least one control signal for causing at least one operation to be performed on the system under test in real-time for testing the system under test in accordance with the one or more test instructions, and monitoring at least one image of the system under test for validating the test procedure in real-time, the at least one image captured in real-time as the at least one operation is performed.

Many further features and combinations thereof concerning the present improvements will appear to those skilled in the art following a reading of the instant disclosure.

DESCRIPTION OF THE FIGURES

In the figures,

FIG. 3 is an example embodiment of a computing device for implementing the test unit of FIG. 1.

It will be noted that throughout the appended drawings, like features are identified by like reference numerals.

DETAILED DESCRIPTION

Figure 1:
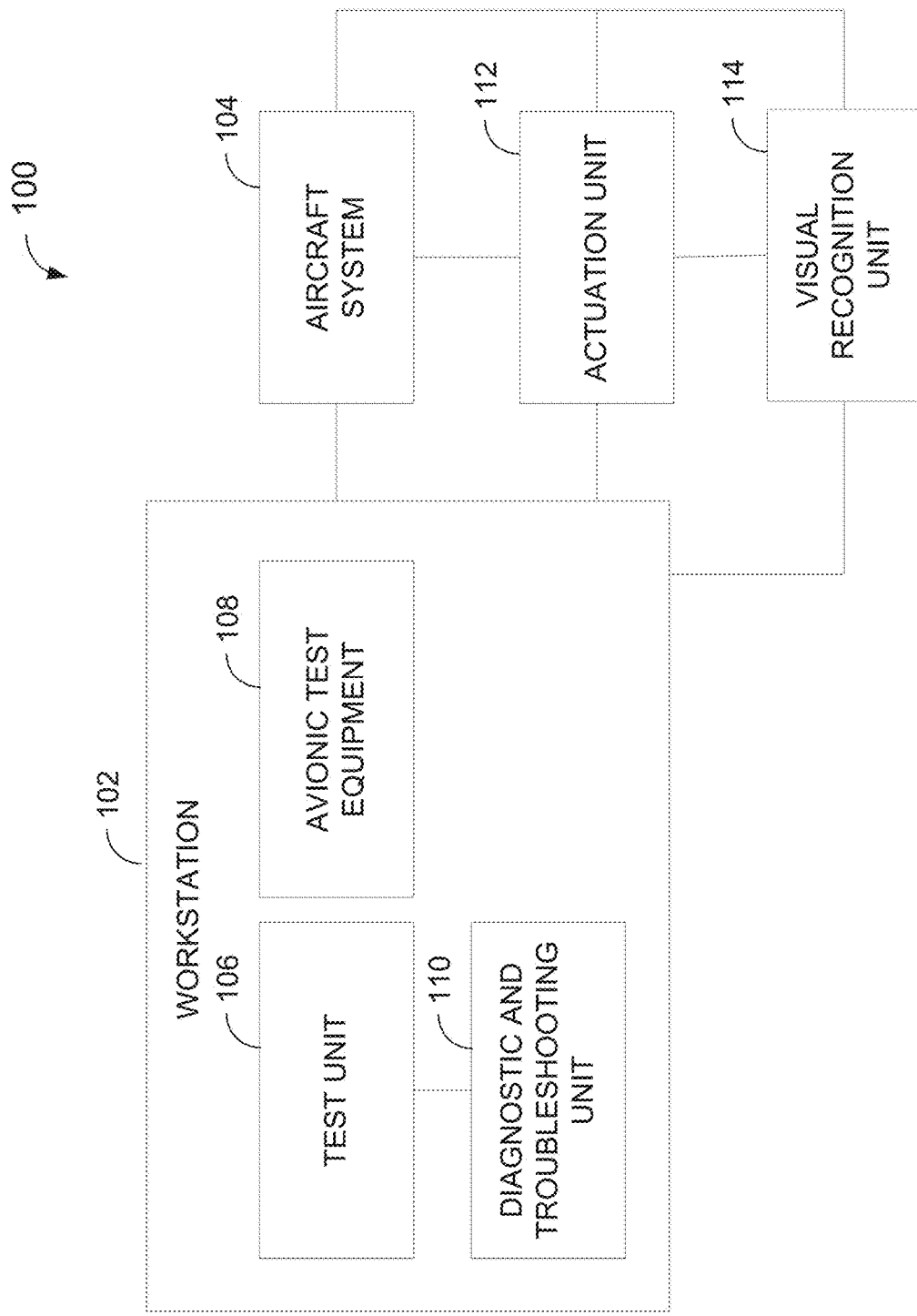
FIG. 1 is a block diagram of an example system for performing a test procedure, in accordance with one embodiment.

Referring to FIG. 1, an example system 100 for performing a test procedure, in accordance with one embodiment, will now be described. Although the system 100 is illustrated and described herein as being used to test an aircraft system, it should be understood that a variety of other systems may apply. The system 100 may indeed be used to test any electrical or electronic system requiring quality control testing and/or manual input from a technician, including, but not limited to boat systems, car systems, train systems, and satellite systems. Examples of an aircraft system include, but are not limited to, a hydraulics system, an engine system, a fuel system, a navigation system, a landing gear system, a flap control system, an electricity generating system, and a cabin climate control system. Any other suitable vehicle or system may apply.

The illustrated system 100 comprises a workstation 102, onto which a test unit 106 and at least one test equipment, such as avionic test equipment, 108 may be integrated, such that the workstation 102 may be customized to a given application or user needs. In one embodiment, the test equipment 108 comprises a resistor box. It should however be understood that any other suitable test equipment may apply. The workstation 102 is in turn interfaced with a system under test, such as an aircraft system 104, through any suitable means. As will be discussed further below, in one embodiment, the workstation 102 is interfaced with the aircraft system 104 through an attachment means (e.g., a test harness), at least one actuation unit (e.g., a computer-controlled robotic device) 112, and a visual recognition unit 114 comprising one or more image acquisition devices (i.e. cameras) with graphic recognition capabilities. Although illustrated as being separate entities, it should be understood that the actuation unit 112 and the visual recognition unit 114 may be incorporated as a single entity (e.g., the image acquisition device(s) may be provided on the robotic device). As will also be discussed further below, the test unit 106 and the avionic test equipment 108 may be used to test the aircraft system 104 in accordance with a predefined test procedure (e.g. an FTP), with the test unit 106 being used to implement operations that would typically be performed manually as part of the test procedure and the avionic test equipment 108 being used to perform remaining FTP tests. Once the test procedure is completed, the aircraft system 104 may be brought back to its original configuration or any configuration defined by the FTP. In one embodiment, the workstation 102 is located outside (e.g. in front of) the aircraft (not shown) and the equipment installed on the workstation 102 is modular so as to be removable for calibration and/or repair purposes.

In one embodiment, the system 100 may be used in aircraft (as in 202 in FIG. 2A) with an integrated flight deck. It should however be understood that the system 100 may also be used in aircraft having an analog flight deck. In the latter case, instead of the test unit 106 remaining on the workstation 102 at all times, the test unit 106 may be brought inside the cockpit in order to allow access to devices, such as gauges and switches, provided in the flight deck. As such, the test unit 106 may be provided on the workstation 102 as a standby device or as a portable device.

Figure 2A:
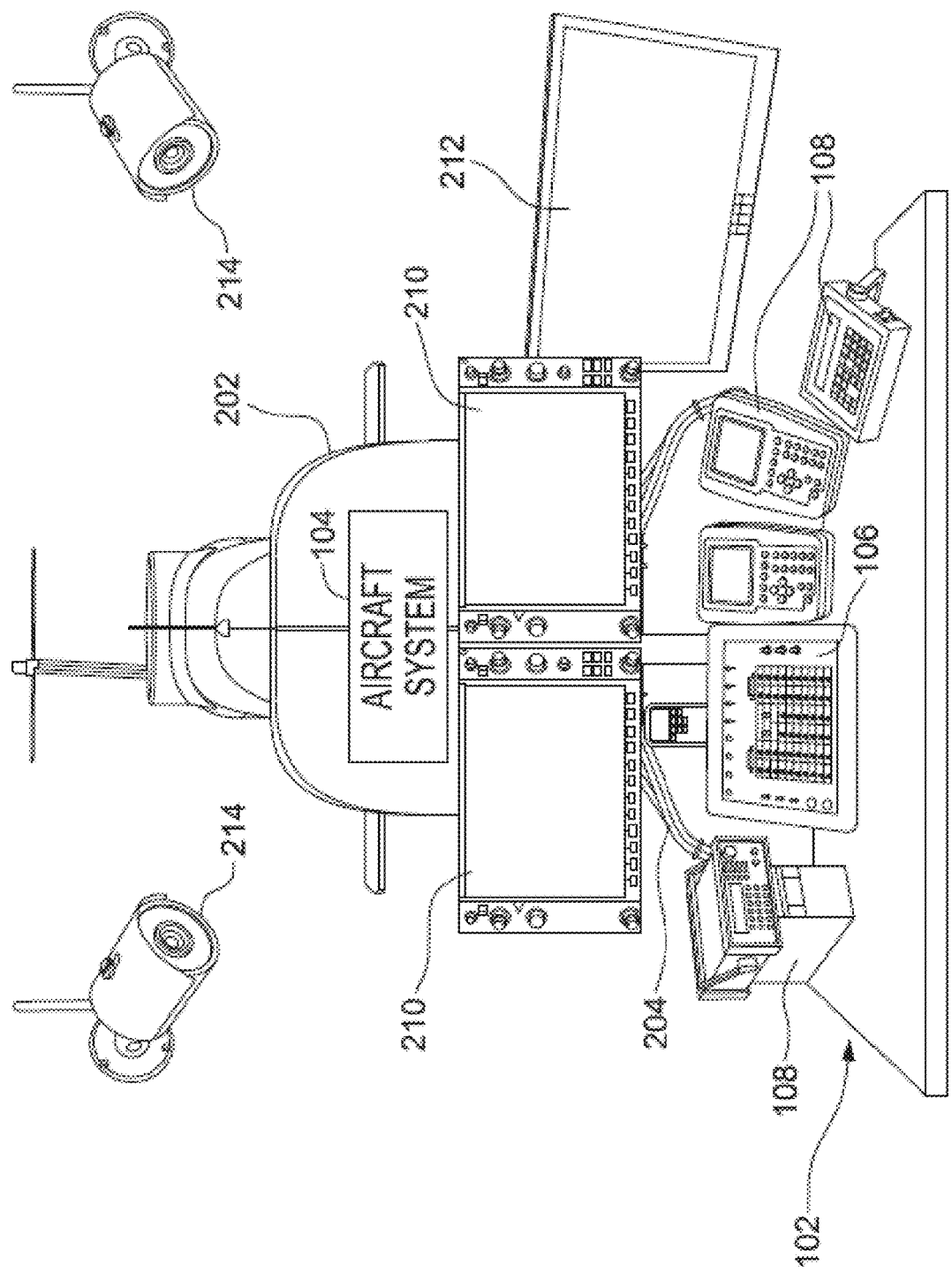
FIG. 2A is a front view of the system of FIG. 1 when used for testing an aircraft system, in accordance with one embodiment.
Figure 2B:
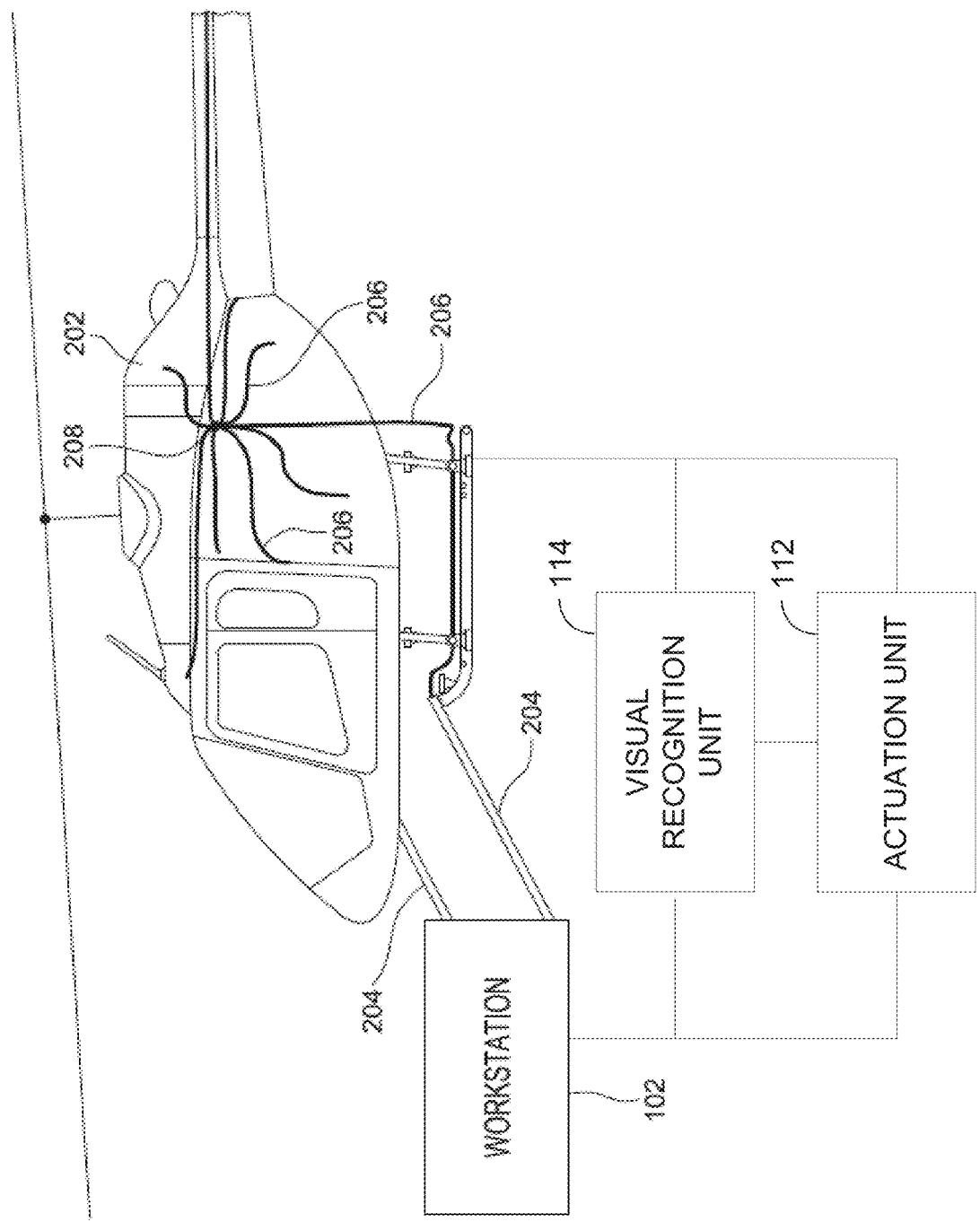
FIG. 2B is a side view of the system of FIG. 1 when used for testing an aircraft system, in accordance with one embodiment.
Figure 2C:
FIG. 2C shows the actuation unit of FIG. 1 when used for testing an aircraft system, in accordance with one embodiment.

In one embodiment illustrated in FIG. 2A, FIG. 2B, and FIG. 2C, the test unit 106 is interfaced with the aircraft system 104 through one or more attachment means 204 (e.g. solid fixtures, such as metal beams or the like) used to attach the workstation 102 to the aircraft 202. At least one electrical wiring harness (or patch cable) 206 may be used to connect each connector (not shown) of the aircraft system 104 under test to the workstation 102 (e.g. to the test unit 106). For example, the wiring harness(es) 206 may be connected to a connector disconnect box 208 of the aircraft 202. In this manner, all connecting (and disconnecting) operations may be performed at once when installing (and removing) the wiring harness(es) 206, thereby decreasing the amount of time required to perform the overall test procedure. The wiring harness 206 may comprise a bundle of individual connector wires (not shown) of varying gauges, types, and impedances. The connector wires may be arranged and distributed at various locations within the aircraft 202. In one embodiment, the end connections (not shown) of the harness 206 on the aircraft 202 are determined by the FTP, such that the end connections of the harness 206 are in a specific location but the harness routing between the end connections of the harness 206 and the test unit 106 are not specific. Health and safety as well as harness length are factors used to determine the securing locations of the harness(es) 206.

In one embodiment, the workstation 102 has installed thereon component(s) that are removable from the aircraft 202 for use during the FTP. One or more cameras may then be used to give visual access to any component that cannot (or need not) be removed from the aircraft 202 and installed on the workstation 102. For example, aircraft flight displays as in 210 may be removed from the aircraft 202, installed on the workstation 102, and interfaced with their original connector(s) through an extension harness (not shown). In another embodiment, screens may be installed on the workstation 102 and connected to one or more cameras located inside the cockpit and configured to monitor standby instruments that cannot be taken out of the aircraft 202. Graphic recognition software may be provided on the cameras to allow for results (e.g. readings from the aircraft standby instruments, displays 212, gauges, or the like) to be detected automatically. Visual checks may also be performed (e.g. by an operator) through displays 212 connected to cameras (e.g. Wi-Fi cameras 214) configured to capture image(s) (e.g. photo(s) and/or video(s)) of the aircraft standby instruments. In addition, completion and verification steps may be performed using data bus readers for redundancy. As will be discussed further below, the validation unit 114 may further be used in combination with the actuation unit 112 to perform and validate the FTP tests.

Backup power (not shown) may also be provided on the workstation 102 to prevent damage to the test equipment (e.g. the test unit 106 and/or the avionic test equipment 108) in the event of a power failure.

In one embodiment, the workstation 102 is used to perform one or more FTP tests of a given test sequence. Provision of the test unit 106 and the avionic test equipment 108 together on the workstation 102 then allows for the FTP tests to be centralized and performed from a single location. In order to increase efficiency and standardize troubleshooting, aircraft technical documentation may also be made available on the workstation 102.

In one embodiment, based on the FTP, each manual intervention (e.g. each manual electrical FTP step) to be performed on the aircraft 202 is illustratively performed through the test unit 106 in a centralized manner, as discussed above. For example, the test unit 106 may be configured to automatically (or semi-automatically) perform (e.g., simulate) operations (e.g., physical actions to be performed in the cockpit) including, but not limited to, simulating a short to the ground, disconnecting a connector, injecting a signal, a voltage, a current, simulating a resistance, impedance, capacitance, or inductance, measuring a voltage, current, resistance, impedance, capacitance, or inductance, pressing a switch, turning a knob, entering data through an input device (e.g., a keypad) associated with the aircraft system 104, asserting a visual pass criteria, and reading data. For this purpose, the workstation 102 may be communicatively coupled to a storage unit (e.g. a memory, not shown) storing the pre-programmed FTP instructions, with the test unit 106 being configured to transcribe or convert the written FTP procedure into an electronic version. For example, and as will be discussed further below, if an FTP instruction comprises disconnecting a connector, the test unit 106 generates a control signal that causes a switch to open, thereby recreating the same disconnecting condition but through the test unit 106.

In one embodiment, the FTP instructions may be written so as to group together operations requiring an operation to be performed on the aircraft 202. In particular, a first group of FTP instructions may be created, the first group consisting of all FTP tests to be performed using the workstation 102. The first group of FTP instructions could in turn be subdivided into a first subgroup comprising FTP tests (e.g. manual operations) that are to be performed (e.g. simulated) using the test unit 106 and a second subgroup comprising remaining FTP tests that are to be performed using other equipment (e.g. avionic test equipment 108) installed on the workstation 102. A second group of FTP instructions may also be created, the second group of FTP instructions consisting of all FTP tests (e.g. radio checks) that cannot be performed through the workstation 102 as well as FTP tests (e.g. bit tests and manually activated self-tests) that are to be performed to inspect the integrity of the aircraft system 104 subsequent to the first group of FTP instructions being executed.

In one embodiment, the manual FTP operations may be semi-automated. For this purpose, the test unit 106 may comprise a plurality of switches (not shown) and may be wired such that each switch creates the necessary condition(s) to perform any required operation as part of the FTP. For example, if an operation in the FTP instructs to disconnect a connector and inject a ground in a pin, this manual operation may be simulated using the test unit 106. For this purpose, a patch harness (not shown) may be connected to the connector. The patch harness may for example consist of a wire connected in the pin and routed to the test unit 106. In the test unit 106, the wire may in turn be connected to a switch that, when activated (i.e. turned ON), may connect the wire to a ground. It should be understood that any condition required by the FTP may be recreated in a similar manner using the test unit 106 and other embodiments may therefore apply.

In another preferred embodiment, the need for manual switches may be alleviated by fully automating the manual FTP operations. For this purpose, the test unit 106 may comprise a programmable logic controller (PLC), a microcontroller, or any other suitable computing device (discussed further below) configured to cause the manual operations to be simulated. In other words, the system 100 may be wired and programmed in such a way that a computerized action creates the necessary condition to perform a given FTP instruction. Using such a device, the test unit 106 may for example be used to inject a voltage to simulate a transducer and test a fuel system without having to physically fuel the aircraft. The test unit 106 may also be used to simulate any type of measuring device, sensing device, or the like installed on any system, whether electric or otherwise. For example, the test unit 106 may be used to activate a calibrated pressure pump in order to apply a specific pressure level such that when the pump is turned ON, the pump builds a given pressure (e.g. 100 psi). The test unit 106 may then be used to turn the pump ON and OFF when required to automatically simulate a specific pressure in a pressurized system.

In another embodiment, the test unit 106 may be used to simulate emission of a radio-frequency (RF) signal (e.g. instruct hardware installed on the aircraft system 104 to emit the RF signal) in order to test a communication and navigation system of the aircraft. In yet another embodiment, the test unit 106 may be used to program and control an air data test set with a specific sequence (e.g. defined by engineering documentation). The test unit 106 may therefore be used to simulate (e.g. include in the test sequence) and control (e.g. turn ON and/or OFF) any test equipment, including the avionic test equipment 108, which may be electrically controlled to test a given system. For example, the avionic test equipment 108 may be simulated using the test unit 106 and the avionic test equipment 108 may therefore be integrated with the test unit 106 (i.e. not provided separately therefrom as illustrated in FIG. 2A). In one embodiment, a Graphical User Interface (GUI) (e.g., handheld or fixed) may be used to receive input data for launching a given test sequence and control when steps of the given test sequence are to be performed.

As previously discussed, the workstation 102 is also illustratively operatively coupled to at least one actuation unit 112, such as a robotic arm (as shown in FIG. 2C) or the like, that interfaces the workstation 102 with the aircraft system 104. The actuation unit 112 is illustratively computer-controlled and configured to automatically perform physical actions in real-time, in accordance with the FTP instructions. For instance, in one embodiment, a given FTP instruction may require creation of an open circuit on a specific wire, followed by verification of a specific message (e.g., a warning message) shown on the aircraft flight display(s) as in 210 and actuation of a button to reset the message. In order to implement this FTP instruction, the workstation 102 may be wired and programmed in such a way that the condition (i.e. open circuit) defined by the given FTP instruction in order to get the specific message is performed automatically. For example, as discussed above, the test unit 106 may generate a control signal that causes the open circuit on the specific wire. The warning message may then be displayed as a result and validated through the visual recognition unit 114 (e.g., cameras equipped with graphic recognition software) that interfaces the aircraft system 104 with the workstation 102. In one embodiment, the visual recognition unit 114 is configured to capture one or more images of the system under test (e.g., images of the aircraft system 104 and/or screenshot(s) of data presented on the displays 210) while the test procedure is being performed. The test unit 106 may then generate one or more control signals to cause the actuation unit 112 to press the button and accordingly reset the warning message, as required by the given FTP instruction. All the steps required by the FTP instruction are illustratively performed automatically (e.g., using the actuation unit 112), in the sequence defined by the FTP instruction, and the required validation performed through the visual recognition system 114 (e.g., by monitoring the acquired images to evaluate test criteria defined by the test procedure), as will be discussed further below.

The images captured by the visual recognition unit 114 may be stored in memory and used to validate the test procedure, as well as for quality control and certification purposes. In addition, the visual recognition unit 114 is illustratively configured to perform an optical character recognition (OCR) procedure in real-time for further validation and quality control. The visual recognition unit 114 may indeed be configured to recognize specific characters, colours, and images, which are presented in specific areas of the displays 210 and which are indicative of results of the FTP test(s). During the OCR process, the camera(s) of the visual recognition unit 114 thus detect information (e.g., character(s), colour(s), and/or image(s)) presented on the displays 210 while the test procedure is being performed. Once the visual recognition unit 114 has interpreted the detected information, the visual recognition unit 114 then outputs a result of the OCR process for later use, e.g., for diagnostic and troubleshooting purposes as will be discussed further below.

Referring back to FIG. 1, in one embodiment, the workstation 102 further comprises a diagnostic and troubleshooting unit 110, which may receive the results of the tests performed using the test unit 106 and/or the other test equipment (e.g. the avionic test equipment 108). For example, the diagnostic and troubleshooting unit 110 may receive one or more output signals from the aircraft system 104 in response to the test being performed using the workstation 102. The test results are then compared to one or more test criteria (e.g. expected result) to assess pass or fail of the test(s) and the result of the comparison can be visually confirmed (using the visual recognition unit 114). In one embodiment, the diagnostic and troubleshooting unit 110 may receive (using any suitable communication means) one or more outputs of the OCR process performed by the visual recognition unit 114. The diagnostic and troubleshooting unit 110 may also retrieve from memory the images captured by the visual recognition unit 114, the images being indicative of the test results, as discussed above. The diagnostic and troubleshooting unit 110 may then use artificial intelligence (e.g., machine learning) techniques to process (e.g., perform correlation on) the received data and accordingly assess pass or fail of the test(s). Any suitable artificial intelligence technique may be used. A quality report may be produced based on the test criteria and any other quality and/or engineering-related requirements. In particular, if the test results satisfy one or more test criteria defined by the test procedure, the diagnostic and troubleshooting unit 110 concludes to success of the test(s). Otherwise, if any test result fails to satisfy the test criteria, it is determined that the test(s) failed. Any issue or non-quality occurrence (also referred to herein as a "snag") may then be reported in the quality report, with an associated troubleshooting sequence that may be automatically initiated to troubleshoot the faulty system. The troubleshooting sequence is illustratively unique to each issue or snag and each step of the troubleshooting sequence may be programmed in advance and stored in memory. Access to recorded information (e.g., test results, snag information, troubleshooting information, etc. collected and stored from past and current FTP procedures) may be provided via a centralized website.

In one embodiment, the diagnostic and troubleshooting unit 110 accesses (e.g. retrieves from a memory and/or database) a wiring diagram of the aircraft system 104 and measures a resistance of electrical wires provided on the aircraft system 104 to determine which part of the aircraft system 104 under test is faulty. Once the faulty wire (or wires) has been identified, the diagnostic and troubleshooting unit 110 may output a signal comprising an indication of a distance at which the wire is broken, thereby allowing for fast location of the problem and quick fix. The diagnostic and troubleshooting unit 110 may also inject one or more signals in the faulty aircraft system 104 to activate relays in order to perform a complete verification of the functionality of the faulty aircraft system 104. If the diagnostic and troubleshooting unit 110 is unable to determine what or where the faulty condition is, the diagnostic and troubleshooting unit 110 may provide a report to this effect. The report may comprise all the documentation necessary for an operator to carry out the troubleshooting. After the fault has been repaired, the faulty section of the test procedure may be restarted to confirm the integrity and functionality of the previously faulty system.

FIG. 3 is an example embodiment of a computing device 300 for implementing the test unit (reference 106 in FIG. 1). It should be understood that the diagnostic and troubleshooting unit (reference 110 in FIG. 1) may also be implemented using the computing device 300. The computing device 300 comprises a processing unit 302 and a memory 304 which has stored therein computer-executable instructions 306. The processing unit 302 may comprise any suitable devices configured to cause a series of steps to be performed such that instructions 306, when executed by the computing device 300 or other programmable apparatus, may cause the functions/acts/steps specified in the methods described herein to be executed. The processing unit 302 may comprise, for example, any type of general-purpose microprocessor or microcontroller, a digital signal processing (DSP) processor, a central processing unit (CPU), an integrated circuit, a field programmable gate array (FPGA), a reconfigurable processor, other suitably programmed or programmable logic circuits, or any combination thereof.

The memory 304 may comprise any suitable known or other machine-readable storage medium. The memory 304 may comprise non-transitory computer readable storage medium, for example, but not limited to, an electronic, magnetic, optical, electromagnetic, infrared, or semiconductor system, apparatus, or device, or any suitable combination of the foregoing. The memory 304 may include a suitable combination of any type of computer memory that is located either internally or externally to device, for example random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like. Memory 304 may comprise any storage means (e.g., devices) suitable for retrievably storing machine-readable instructions 306 executable by processing unit 302.

Figure 4:
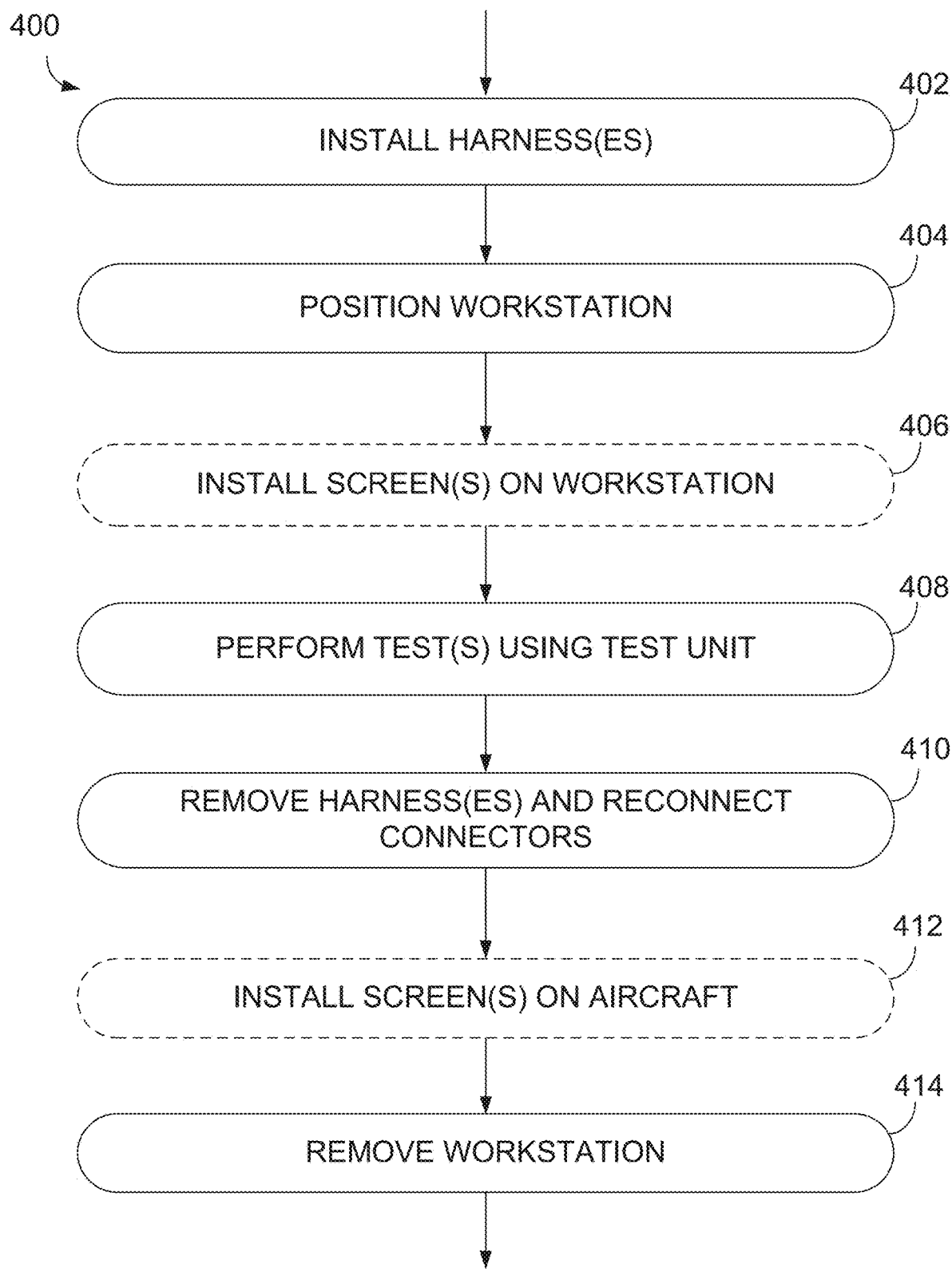
FIG. 4 is a flowchart of an example method for performing a test procedure, in accordance with one embodiment.

Referring now to FIG. 4, an example method 400 for performing a test procedure, in accordance with one embodiment, will now be described. The illustrated method 400 may be used to perform an FTP on an aircraft system. The method 400 may comprise installing at least one wiring harness (or patch cable(s)) at step 402, e.g. connecting the wiring harness(es) to the aircraft connector disconnect box. The next step 404 is then to put the workstation in place, e.g. electrically interface the workstation with the aircraft system using the wiring harness(es), as discussed herein above. One or more screens may then optionally be installed on the workstation at step 406. This may comprise installing on the workstation flight displays removed from the aircraft and interfacing the flight displays with their original connector(s) through an extension harness. As discussed above with reference to FIG. 2A and FIG. 2B, in one embodiment, no screens are removed from the aircraft and test results are monitored through at least one camera system (e.g. using graphic recognition or a screen connected to Wi-Fi cameras).

The test unit is then used at step 408 to perform one or more tests in accordance with the FTP, as discussed above. Step 408 may comprise simulating at least one operation on the aircraft system in real-time for testing the aircraft system in accordance with FTP instruction(s) retrieved from memory. In a preferred embodiment, the operation is simulated in real-time in a fully-automated manner using the test unit in conjunction with the actuation unit and the visual recognition unit discussed herein above. As also discussed above, step 408 may also comprise validating the test(s) in real-time. Once the FTP has been performed, the wiring harness(es) may be removed and connectors reconnected at step 410. The one or more screens may then be optionally returned to the aircraft and installed thereon at step 412 and the workstation removed at step 414. It becomes apparent that the method 400 may allow to reduce the amount of time required to perform the FTP in addition to decreasing the amount of physical movement around the aircraft and minimizing the possibility of human errors.

The above description is meant to be for purposes of example only, and one skilled in the relevant arts will recognize that changes may be made to the embodiments described without departing from the scope of the invention disclosed. For example, the blocks and/or operations in the flowcharts and drawings described herein are for purposes of example only. There may be many variations to these blocks and/or operations without departing from the teachings of the present disclosure. For instance, the blocks may be performed in a differing order, or blocks may be added, deleted, or modified.

While illustrated in the block diagrams as groups of discrete components communicating with each other via distinct data signal connections, it will be understood by those skilled in the art that the present embodiments are provided by a combination of hardware and software components, with some components being implemented by a given function or operation of a hardware or software system, and many of the data paths illustrated being implemented by data communication within a computer application or operating system. Based on such understandings, the technical solution of the present invention may be embodied in the form of a software product. The software product may be stored in a non-volatile or non-transitory storage medium, which can be a read-only memory (ROM), a magnetic disk, an optical disc, a flash drive, or any other suitable storage media or device.

Each computer program described herein may be implemented in a high level procedural or object oriented programming or scripting language, or a combination thereof, to communicate with a computer system. Alternatively, the programs may be implemented in assembly or machine language. The language may be a compiled or interpreted language. The software product includes a number of instructions that enable a computer device (personal computer, server, or network device) to execute the methods provided in the embodiments of the present invention. Computer-executable instructions may be in many forms, including program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments. The structure illustrated is thus provided for efficiency of teaching the present embodiment. The present disclosure may be embodied in other specific forms without departing from the subject matter of the claims.

Also, one skilled in the relevant arts will appreciate that while the systems, methods and computer readable mediums disclosed and shown herein may comprise a specific number of elements/components, the systems, methods and computer readable mediums may be modified to include additional or fewer of such elements/components. The present disclosure is also intended to cover and embrace all suitable changes in technology. Modifications which fall within the scope of the present invention will be apparent to those skilled in the art, in light of a review of this disclosure, and such modifications are intended to fall within the appended claims.

What is claimed is:

1. A system for performing a test procedure on a system under test, the system comprising:
    an actuation unit operatively coupled to the system under test and configured to perform at least one operation thereon;
    a visual recognition unit configured to capture at least one image of the system under test in real-time; and
    a test unit remotely interfaced with the system under test and configured to perform the test procedure thereon, the test unit comprising
        a non-transitory memory having stored therein the test procedure comprising one or more test instructions for testing the system under test,
        at least one processing unit, and
        at least one application stored in the memory and executable by the at least one processing unit for:
        retrieving the test procedure from the memory,
        outputting at least one control signal to the actuation unit for causing the at least one operation to be performed in real-time for testing the system under test in accordance with the one or more test instructions, and
        monitoring the at least one image of the system under test as the at least one operation is performed for validating the test procedure in real-time.

2. The system of claim 1, wherein the actuation unit comprises a robotic arm.

3. The system of claim 1, wherein the visual recognition unit comprises at least one image acquisition device with graphic recognition capability.

4. The system of claim 1, wherein the at least one application is executable by the at least one processing unit for outputting the at least one control signal for causing the at least one operation comprising at least one of simulating a short to ground, disconnecting a connector, injecting a signal, injecting a voltage, injecting a current, simulating a resistance, simulating an impedance, simulating a capacitance, simulating an inductance, measuring a voltage, measuring a current, measuring a resistance, measuring an impedance, measuring a capacitance, measuring an inductance, pressing a switch, turning a knob, and entering data through an input device associated with the system under test to be performed.

5. The system of claim 1, wherein the system under test is an aircraft system selected from the group consisting of a hydraulics system, an engine system, a fuel system, a navigation system, a landing gear system, a flap control system, an electricity generating system, and a cabin climate control system.

6. The system of claim 1, wherein the test unit is electrically interfaced with the system under test through at least one cable connecting each electrical connector of the system under test to the test unit.

7. The system of claim 5, wherein the visual recognition unit is configured to capture the at least one image of at least one standby aircraft instrument.

8. The system of claim 1, wherein the at least one application is executable by the at least one processing unit for:
    monitoring the at least one image in real-time and determining at least one test result therefrom;
    comparing the at least one test result to at least one test criterion defined by the test procedure;
    responsive to determining that the at least one test result satisfies the at least one test criterion, concluding to a pass of the test procedure; and
    responsive to determining that the at least one test result does not satisfy the at least one test criterion, concluding to a failure of the test procedure.

9. The system of claim 8, further comprising a troubleshooting unit connected to the test unit and configured to automatically troubleshoot the system under test responsive to concluding to the failure of the test procedure.

10. A method for performing a test procedure on a system under test, the method comprising:
    remotely interfacing a test unit with the system under test; and
    using the test unit,
        retrieving from memory the test procedure comprising one or more test instructions for testing the system under test,
        outputting at least one control signal for causing at least one operation to be performed on the system under test in real-time for testing the system under test in accordance with the one or more test instructions, and
        monitoring at least one image of the system under test for validating the test procedure in real-time, the at least one image captured in real-time as the at least one operation is performed.

11. The method of claim 10, wherein the at least one control signal is output for causing the at least one operation comprising at least one of simulating a short to ground, disconnecting a connector, injecting a signal, injecting a voltage, injecting a current, simulating a resistance, simulating an impedance, simulating a capacitance, simulating an inductance, measuring a voltage, measuring a current, measuring a resistance, measuring an impedance, measuring a capacitance, measuring an inductance, pressing a switch, turning a knob, and entering data through an input device associated with the system under test to be performed.

12. The method of claim 10, wherein remotely interfacing the test unit with the system under test comprises electrically interfacing the test unit with the system under test through at least one cable connecting each electrical connector of the system under test to the test unit.

13. The method of claim 10, further comprising integrating the test unit and at least one avionic test equipment on a workstation electrically interfaced with the system under test.

14. The method of claim 10, further comprising:
    monitoring the at least one image in real-time and determining at least one test result therefrom;
    comparing the at least one test result to at least one test criterion defined by the test procedure;
    responsive to determining that the at least one test result satisfies the at least one test criterion, concluding to a pass of the test procedure; and
    responsive to determining that the at least one test result does not satisfy the at least one test criterion, concluding to a failure of the test procedure.

15. The method of claim 14, further comprising automatically troubleshooting the system under test responsive to concluding to failure of the test procedure.

16. A non-transitory computer readable medium having stored thereon program code executable by a processor for:
   retrieving from memory a test procedure comprising one or more test instructions for testing a system under test,
   outputting at least one control signal for causing at least one operation to be performed on the system under test in real-time for testing the system under test in accordance with the one or more test instructions, and
   monitoring at least one image of the system under test for validating the test procedure in real-time, the at least one image captured in real-time as the at least one operation is performed.

\* \* \* \* \*